United States Patent
Yao et al.

(10) Patent No.: US 10,640,870 B2
(45) Date of Patent: May 5, 2020

(54) GAS FEEDTHROUGH ASSEMBLY

(71) Applicant: APPLIED MATERIALS, INC., Santa Clara, CA (US)

(72) Inventors: Daping Yao, San Jose, CA (US); Hyman W. H. Lam, San Jose, CA (US); Jiang Lu, Milpitas, CA (US); Dien-Yeh Wu, San Jose, CA (US); Can Xu, San Jose, CA (US); Paul F. Ma, Santa Clara, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 358 days.

(21) Appl. No.: 15/465,526

(22) Filed: Mar. 21, 2017

(65) Prior Publication Data
US 2017/0306488 A1    Oct. 26, 2017

Related U.S. Application Data

(60) Provisional application No. 62/327,402, filed on Apr. 25, 2016.

(51) Int. Cl.
| | |
|---|---|
| C23C 16/50 | (2006.01) |
| C23C 16/458 | (2006.01) |
| C23C 16/455 | (2006.01) |
| C23C 16/44 | (2006.01) |

(52) U.S. Cl.
CPC ........ C23C 16/458 (2013.01); C23C 16/4404 (2013.01); C23C 16/455 (2013.01); C23C 16/45512 (2013.01)

(58) Field of Classification Search
CPC ............ C23C 16/458; C23C 16/45512; C23C 16/4404; C23C 16/455
USPC ......................... 118/715; 156/345.33, 345.34
See application file for complete search history.

(56) References Cited

U.S. PATENT DOCUMENTS

| | | | |
|---|---|---|---|
| 5,755,886 A | 5/1998 | Wang et al. | |
| 7,017,514 B1* | 3/2006 | Shepherd, Jr. | ......... C23C 16/452 118/723 ME |
| 2012/0192398 A1* | 8/2012 | Vo | ....................... H01J 37/3244 29/428 |
| 2014/0339330 A1* | 11/2014 | Hong | ................... C23C 16/4551 239/133 |
| 2015/0376784 A1* | 12/2015 | Wu | ................... C23C 16/45508 427/255.28 |
| 2016/0322200 A1* | 11/2016 | Alayavalli | .......... H01J 37/3244 |

* cited by examiner

*Primary Examiner* — Rudy Zervigon
(74) *Attorney, Agent, or Firm* — Moser Taboada; Alan Taboada

(57) ABSTRACT

A gas feedthrough assembly and processing apparatus using the same are disclosed herein. In some embodiments, the gas feedthrough assembly, includes a dielectric body; at least one channel extending through the dielectric body; and a dielectric tube disposed within the at least one channel, wherein an inner diameter of the at least one channel is greater than an outer diameter of the dielectric tube such that a gap is formed between an outer wall of the dielectric tube and an inner wall of the at least one channel.

20 Claims, 2 Drawing Sheets

GAS FEEDTHROUGH ASSEMBLY

CROSS-REFERENCE TO RELATED APPLICATIONS

This application claims benefit of U.S. provisional patent application Ser. No. 62/327,402, filed Apr. 25, 2016, which is herein incorporated by reference in its entirety.

FIELD

Embodiments of the present disclosure generally relate to substrate processing apparatus, and more specifically, to a gas feedthrough assembly.

BACKGROUND

Some chemical vapor deposition (CVD) processing chambers utilize a dielectric (e.g., aluminum oxide) gas feedthrough to flow process gases from a grounded gas manifold to a mixer that is electrically coupled to an RF power source. The inventors have observed that when a metal-organic precursor gas is flowed through conduits of such a gas feedthrough, the precursor gas is thermally decomposed on the inner surfaces of the conduits. Due to weak adhesion of the decomposed material on the inner surfaces, the quality of a deposited film on a substrate disposed in the processing chamber is negatively affected.

Therefore, the inventors have provided embodiments of an improved gas feedthrough assembly.

SUMMARY

Embodiments of a gas feedthrough assembly and processing apparatus using the same are disclosed herein. In some embodiments, the gas feedthrough assembly, includes a dielectric body; at least one channel extending through the dielectric body; and a dielectric tube disposed within the at least one channel, wherein an inner diameter of the at least one channel is greater than an outer diameter of the dielectric tube such that a gap is formed between an outer wall of the dielectric tube and an inner wall of the at least one channel.

In some embodiments, a processing chamber includes a chamber body having a substrate support disposed within a processing volume; a lid moveably coupled to the chamber body; a lid manifold moveably coupled to an upper surface of the lid and having central channel and at least one gas feed inlet fluidly coupled to the central channel; a gas panel fluidly coupled to the lid manifold via at least one gas line and having at least one gas source and a gas inlet manifold; a gas feedthrough assembly disposed between the gas inlet manifold and the lid manifold. The gas feedthrough assembly includes a dielectric body; at least one channel extending through the dielectric body; and a dielectric tube disposed within the at least one channel and having a first conduit fluidly coupled and corresponding to the at least one gas line, wherein an inner diameter of the at least one channel is greater than an outer diameter of the dielectric tube such that a gap is formed between an outer wall of the dielectric tube and an inner wall of the at least one channel.

In some embodiments, a gas feedthrough assembly includes an aluminum oxide body; a channel extending through the aluminum oxide body; and a quartz tube disposed within the channel and having a first conduit disposed through the quartz tube; a second conduit disposed through the aluminum oxide body, wherein an inner diameter of the channel is greater than an outer diameter of the quartz tube such that a gap is formed between an outer wall of the quartz tube and an inner wall of the channel.

Other embodiments and variations of the present disclosure are discussed below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
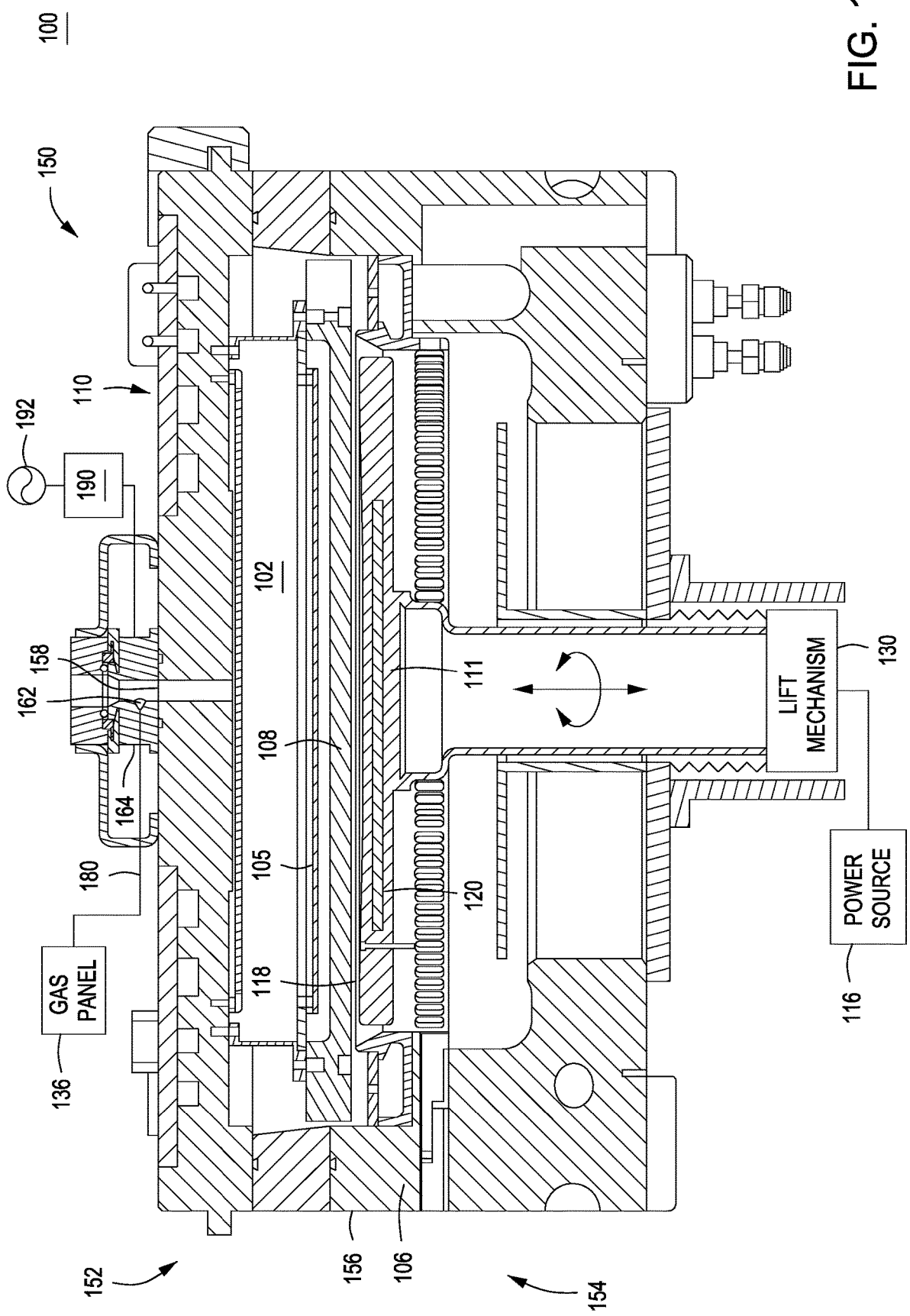
FIG. 1 depicts a simplified cross-sectional view of an exemplary chemical vapor deposition chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a gas feedthrough assembly are disclosed herein. The disclosed gas feedthrough assembly advantageously minimizes defects on a processed substrate. Exemplary chambers such as, chemical vapor deposition (CVD) and metallic chemical vapor deposition (MCVD) are chambers that may be benefited by the inventive apparatus. Examples of CVD processing chambers that may be modified in accordance with the teachings provided herein include the VOLTA® and PRODUCER® chambers, all of which are commercially available from Applied Materials, Inc. of Santa Clara, Calif. Other process chambers that process substrates may also benefit from modification according to the teachings provided herein, including process chambers available from other manufacturers.

FIG. 1 is a cross sectional view of an illustrative single substrate CVD reactor 100. In some embodiments, and as depicted in FIG. 1, the reactor 100 may include a processing chamber 150. The processing chamber 150 generally includes a bottom assembly 154 and an upper assembly 152.

The bottom assembly 154 comprises a chamber body 156 having a wall 106 partially defining an interior of the processing chamber 150. A substrate support assembly 111 is disposed in the bottom assembly 154 for supporting a substrate (not shown) during processing. The substrate support assembly 111 may include a heater 120 configured to regulate the temperature of the substrate and/or temperature in the main processing volume 118 of the processing chamber 150. The heater 120 is coupled to the power source 116. The substrate support assembly 111 is coupled to a lift mechanism 130, such as a motor or actuator, to raise and lower the substrate support assembly 111.

The upper assembly 152 comprises a body 110. In some embodiments, the body 110 may be a lid movably coupled, by a hinge or other suitable mechanism, to the bottom assembly 154. In some embodiments, the body 110 has an central channel 158 through which process gas may enter the process chamber 150 from a gas panel 136, providing process chemicals, in liquid and/or gaseous form.

The body further comprises a plenum 102 and a faceplate 108. In some embodiments, the faceplate 108 is coupled to the body 110 and, together with the body 110, defines the plenum 102 for receiving a process gas via the central channel 158. The faceplate 108 comprises a first side facing the substrate during use and a plurality of gas distribution holes. The gas distribution holes fluidly couple the plenum 102 to the main processing volume 118 disposed on the first side of the faceplate 108.

The gas panel 136 includes at least one gas source to provide a processing gas to the processing chamber 150 via at least one gas line 180. In some embodiments, the gas panel includes a metal organic precursor gas source and a reductant gas source. The gas panel 136 is coupled to the body 110 using a plurality of gas lines. Each gas line may be selectively adapted for transferring specific chemical(s) from the gas panel 136 to the central channel 158, as well as be temperature controlled. In some embodiments, at least one gas feed inlet 162 may be provided in a lid manifold 164 coupled to an upper surface of the body 110 to facilitate delivery of the process chemicals to the process chamber 150. In some embodiments a plurality of gas feed inlets 162 may be provided for delivering a plurality of feed gases to the processing chamber 150. The feed gases may be provided from respective gas sources (such as the gas panel 136) through one or more gas feedthroughs (not shown in FIG. 1) coupled to the gas feed inlets 162. An RF power source 192 may be coupled to the lid manifold 164 via a match network 190 to form a plasma within the central channel 158.

FIG. 2 depicts a gas feedthrough assembly 200 for use with a substrate processing chamber such as the process chamber 150 of FIG. 1. The gas feedthrough assembly 200 includes a body 210 and is disposed between the gas panel 136 and the lid manifold 164 to supply one or more gases to the process chamber 150. The gas feedthrough assembly 200 may be coupled to a gas inlet manifold 206 through which first and second gas lines 180a, 180b of the gas panel 136 pass. Because the lid manifold 164 is coupled to the RF power source 192 and the gas inlet manifold 206 is grounded, the body 210 is formed of a dielectric material such as, for example, aluminum oxide. To avoid condensation of the precursor gas on conduits of the lid manifold 164 and the gas inlet manifold 206, both manifolds are heated. The inventors have observed that flowing a metal organic precursor gas through conduits in conventional dielectric feedthroughs disposed between such heated manifolds results in thermal decomposition of the metal organic precursor gas on the walls of the conduit of the gas feedthrough. The decomposed material on the walls of the conduit contaminates the substrate being processed.

As such, the inventors have provided a tube 208 that is disposed in at least one channel 212 formed in the body 210. The tube 208 is formed of a dielectric material such as, for example, quartz. In some embodiments, the tube 208 may alternatively be formed of other suitable materials such as, for example, polytetrafluoroethylene (Teflon®), silicon nitride, aluminum nitride, or the like. The tube 208 is a thick-walled tube that is rigid enough to withstand vacuum pressure and the installation of the tube 208 in the channel 212. In some embodiments, an inner diameter of the channel 212 is greater than an outer diameter of the tube 208 such that a gap 220 (shown in FIG. 2B) is disposed between the outer wall of the tube 208 and the inner wall of the channel 212 to facilitate insertion of the tube into the channel. In some embodiments, an inner diameter of the channel 212 is about 0.8 inches and an outer diameter of the tube 208 is about 0.79 inches. As such, the gap 220 (shown in FIG. 2B) is about 0.005 inches is disposed between the outer wall of the tube 208 and the inner wall of the channel 212. However, the diameters of the channel 212 and the tube 208 may alternatively be sized differently to accommodate desired processing conditions. In some embodiments, the outer diameter of the tube 208 and the channel 212 are sized so that the gap 220 is alternatively about 5 millimeters.

To minimize the thermal effects of the heated lid manifold 164 and gas inlet manifold 206 on the tube 208 and to provide a vacuum seal, a first pair of o-rings 214 are disposed at a first interface of the tube 208 and the lid manifold 164 and a second interface of the tube 208 and the gas inlet manifold 206. The o-rings may be concentric with the first conduit 202. The first o-rings 214 may be formed of a thermally insulative material to minimize the thermal decomposition of the precursor gas flowing through the tube 208. To further combat decomposition and accumulation of the precursor gas on the inner walls of the tube 208, the inner walls may have a smooth surface finish with a surface roughness between about 5 micro-inches Ra to about 10 micro-inches Ra. The smoothness of the inner walls reduces the accumulation rate of decomposed precursor versus an inner wall that is not smooth. Also, the material of the inner wall (e.g., quartz, polytetrafluoroethylene (Teflon®), silicon nitride, aluminum nitride or the like) improves sticking of the residue to the inner wall, thus advantageously further decreasing contamination of the substrate being processed.

Figure 2A:
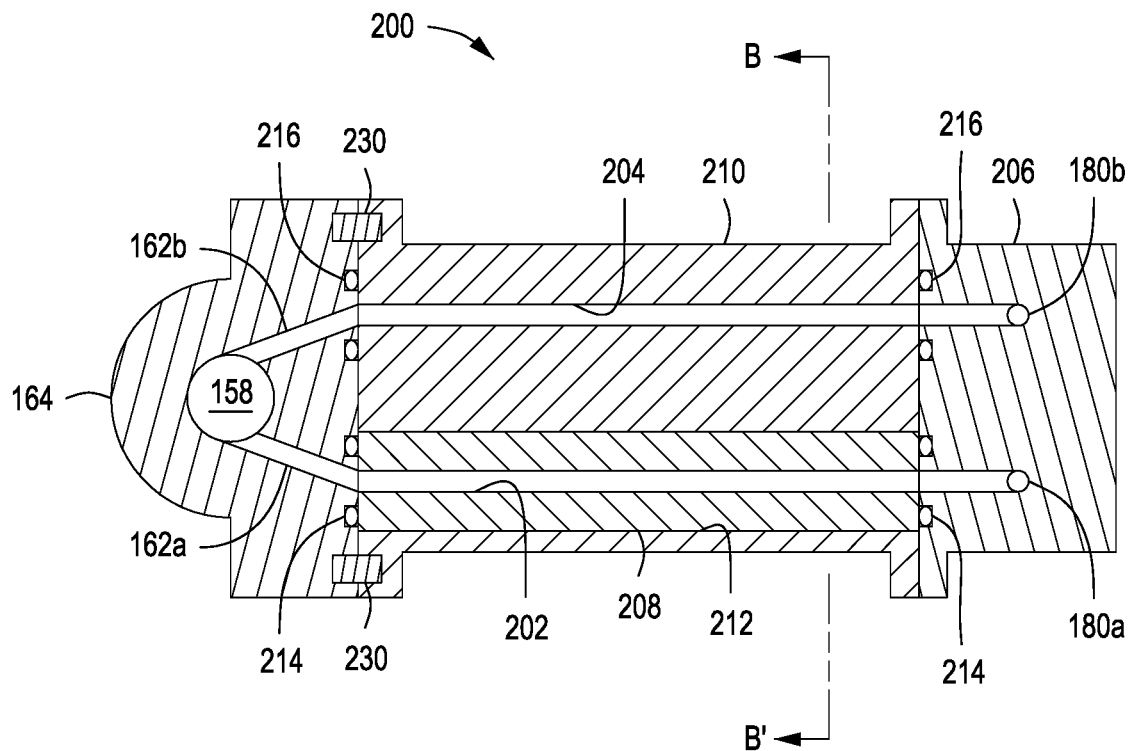
FIG. 2A depicts a top cross-sectional view of a gas feedthrough assembly in accordance with some embodiments of the present disclosure.
Figure 2B:
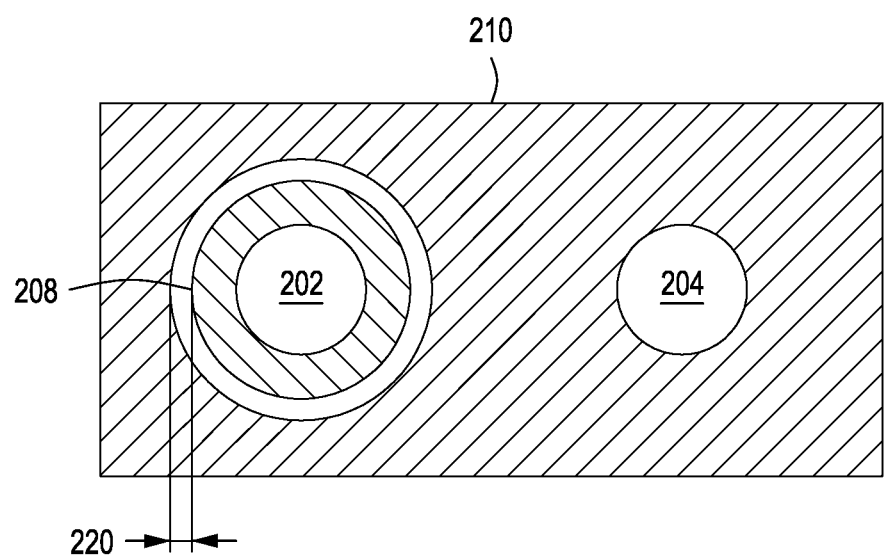
FIG. 2B depicts a cross sectional view taken along line B-B' of the gas feedthrough assembly of FIG. 2A.

In the embodiment depicted in FIG. 2, the gas feedthrough assembly 200 includes two conduits: a first conduit 202 disposed through the tube 208 and a second conduit 204 disposed through the body 210. However, the gas feedthrough assembly 200 may include fewer or more conduits. The first and second conduits 202, 204 may be used to flow one or more gases into the central channel 158. In some embodiments, the first conduit 202 may be used to flow a precursor gas from the first gas line 180a and the second conduit 204 may be used to flow a reductant gas from the second gas line 180b to be mixed in the central channel 158 for processing a substrate. The first and second conduits 202, 204 may be diametrically sized to achieve a desired flow conductance. In some embodiments, the precursor gas may be a metal organic precursor. Although only one tube 208 is illustrated in FIGS. 2A and 2B, the second conduit 204 may alternatively be a channel large enough to accommodate a second tube.

The first and second conduits 202, 204 are coupled to respective gas feed inlets 162a, 162b of the lid manifold 164 to supply the precursor and reductant gases to the central channel 158 for mixing. A second pair of o-rings 216 is disposed at a first interface of the body 210 and the lid manifold 164 and a second interface of the body 210 and the gas inlet manifold 206 and is concentric with the second conduit 204 to provide a vacuum seal. In some embodiments, similar to the first pair of o-rings 214, the second pair of o-rings 216 is also thermally insulative. In some embodiments, one or more alignment pins 230 may be inserted into the lid manifold 164 at the interface of the lid manifold 164 and the gas feedthrough assembly 200. The body 210 may include corresponding alignment holes for receiving the one or more alignment pins 230 protruding from lid manifold 164.

Embodiments of a gas feedthrough assembly have been provided herein. The gas feedthrough assembly advantageously minimizes thermal decomposition and accumulation of precursor gas (e.g., metal organic precursor gas) on inner walls of a conduit through which the precursor gas flows. The gas feedthrough assembly also advantageously reduces cleaning time because the tube is the only structure that is cleaned since the tube is the only portion of the gas feedthrough assembly that comes into contact with the precursor gas. The tube can be removed for cleaning and reinserted into the channel formed in the body of the gas feedthrough assembly. Although the above embodiments have been discussed with regards to a metal organic precursor, other precursors may be benefited from the gas feedthrough assembly according to the present disclosure. As such, the tube may be formed of different materials to address specific needs for different types of precursor gases.

While the foregoing is directed to embodiments of the present disclosure, other and further embodiments of the disclosure may be devised without departing from the basic scope thereof.

The invention claimed is:

1. A gas feedthrough assembly, comprising:
a dielectric body;
at least one channel extending through the dielectric body; and
a dielectric tube disposed within the at least one channel, wherein an inner diameter of the at least one channel is greater than an outer diameter of the dielectric tube such that a gap is formed between an outer wall of the dielectric tube and an inner wall of the at least one channel, wherein the gap is fluidly independent from an interior volume of the dielectric tube and extends from a first side of the dielectric body to a second side of the dielectric body opposite the first side.

2. The gas feedthrough assembly of claim 1, wherein an inner wall of the dielectric tube has a surface roughness between about 5 micro-inches Ra to about 10 micro-inches Ra.

3. The gas feedthrough assembly of claim 1, wherein the dielectric body is formed of aluminum oxide.

4. The gas feedthrough assembly of claim 1, wherein the dielectric tube is formed, of quartz, polytetrafluoroethylene, silicon nitride, or aluminum nitride.

5. The gas feedthrough assembly of claim 1, wherein the outer diameter of the dielectric tube is about 0.79 inches and the inner diameter of the channel is about 0.8 inches.

6. The gas feedthrough assembly of claim 1, wherein the gap is about 5 millimeters thick.

7. The gas feedthrough assembly of claim 1, further comprising:
a first conduit disposed through the dielectric tube; and
a second conduit disposed through the dielectric body and spaced apart from the
gap.

8. A processing chamber, comprising:
a chamber body having a substrate support disposed within a processing volume;
a lid moveably coupled to the chamber body;
a lid manifold moveably coupled to an upper surface of the lid and having central channel and at least one gas feed inlet fluidly coupled to the central channel;
a gas panel fluidly coupled to the lid manifold via at least one gas line and having at least one gas source and a gas inlet manifold;
a gas feedthrough assembly disposed between the gas inlet manifold and the lid manifold, the gas feedthrough assembly comprising:
a dielectric body;
at least one channel extending through the dielectric body; and
a dielectric tube disposed within the at least one channel and having first conduit fluidly coupled and corresponding to the at least one gas line,
wherein an inner diameter of the at least one channel is greater than an outer diameter of the dielectric tube such that a gap is formed between an outer wall of the dielectric tube and an inner wall of the at least one channel, wherein the gap is fluidly independent from an interior volume of the dielectric tube and extends from a first side of the dielectric body to a second side of the dielectric body opposite the first side.

9. The processing chamber of claim 8, wherein the gas panel is fluidly coupled to the lid manifold via a first gas line and a second gas line, wherein the first conduit is fluidly coupled to the first gas line, and wherein the gas feedthrough assembly further comprises a second conduit disposed through the dielectric body and fluidly coupled to the second gas line.

10. The processing chamber of claim 9, wherein the first gas line is coupled to a metal organic precursor gas source, and wherein the second gas line is coupled to a reductant gas, source.

11. The processing chamber of claim 9, further comprising:
a first pair of o-rings disposed at a first interface of the dielectric tube and the lid manifold and a second interface of the dielectric tube and the gas inlet manifold, wherein the first pair of o-rings is concentric with the first conduit; and
a second pair of o-rings disposed at a first interface of the dielectric body and the lid manifold and a second interface of the dielectric body and the gas inlet manifold, wherein the second pair of o-rings is concentric with the second conduit.

12. The processing chamber of claim 11, wherein the first and second pairs of o-rings are formed of a thermally insulative material.

13. The processing chamber of claim 8, wherein an inner wall of the dielectric tube has surface roughness between about 5 micro-inches Ra to about 10 micro-inches Ra.

14. The processing chamber of claim 8, wherein the dielectric body is formed of aluminum oxide.

15. The processing chamber of claim 8, wherein the dielectric tube is formed of quartz, polytetrafluoroethylene, silicon nitride, or aluminum nitride.

16. The processing chamber of claim 8, wherein the outer diameter of the dielectric tube is about 0.79 inches and the inner diameter of the channel is about 0.8 inches.

17. The processing chamber of claim 8, wherein the gap is bout 5 millimeters thick.

18. The processing chamber of claim 8, further comprising:
one or more alignment pins disposed in the lid manifold and protruding from a surface of the lid manifold at an interface of the lid manifold and the gas feedthrough assembly; and
one or more alignment holes corresponding to the one or more alignment pins and disposed in the dielectric body.

19. A gas feedthrough assembly, comprising
an aluminum oxide body;
a channel extending through the aluminum oxide body;
a quartz tube disposed within the channel and having a first conduit disposed through the quartz tube; and a second conduit disposed through the aluminum oxide body, wherein an inner diameter of the channel is greater than an outer diameter of the quartz tube such that a gap is formed between an outer wall of the quartz tube and an inner wall of the channel, wherein the gap is fluidly independent from an interior volume of the quartz tube and extends from a first side of the aluminum oxide body to a second side of the aluminum oxide body opposite the first side.

20. The gas feedthrough assembly of claim 19, wherein an inner wall of the quartz tube has a surface roughness between about 5 micro-inches Ra to about 10 micro-inches Ra.

\* \* \* \* \*

UNITED STATES PATENT AND TRADEMARK OFFICE
CERTIFICATE OF CORRECTION

PATENT NO.         : 10,640,870 B2
APPLICATION NO.    : 15/465526
DATED              : May 5, 2020
INVENTOR(S)        : Daping Yao et al.

It is certified that error appears in the above-identified patent and that said Letters Patent is hereby corrected as shown below:

In the Claims

Column 5, Line 41, delete "is formed, of quartz," and insert --is formed of quartz,--

Column 6, Line 4, delete "and having first" and insert --and having a first--

Column 6, Line 25, delete "gas, source." and insert --gas source.--

Column 6, Line 42, delete "has surface" and insert --has a surface--

Column 6, Line 53, delete "is bout 5" and insert --is about 5--

Signed and Sealed this
Sixteenth Day of June, 2020

Andrei Iancu
*Director of the United States Patent and Trademark Office*